(12) United States Patent
Sun

(10) Patent No.: US 10,109,238 B2
(45) Date of Patent: Oct. 23, 2018

(54) SHIFT REGISTER UNIT, DRIVING METHOD THEREOF, SCAN DRIVING CIRCUIT AND DISPLAY APPARATUS

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/520,789

(22) PCT Filed: Sep. 19, 2016

(86) PCT No.: PCT/CN2016/099287
§ 371 (c)(1),
(2) Date: Apr. 20, 2017

(87) PCT Pub. No.: WO2017/118092
PCT Pub. Date: Jul. 13, 2017

(65) Prior Publication Data
US 2018/0090072 A1    Mar. 29, 2018

(30) Foreign Application Priority Data
Jan. 4, 2016   (CN) .......................... 2016 1 0006590

(51) Int. Cl.
*G09G 3/3258* (2016.01)
*G11C 19/28* (2006.01)
*G09G 3/3266* (2016.01)

(52) U.S. Cl.
CPC ......... *G09G 3/3258* (2013.01); *G09G 3/3266* (2013.01); *G11C 19/28* (2013.01)

(58) Field of Classification Search
CPC .. G09G 3/3258; G09G 3/3266; G09G 3/3677; G09G 2310/0286; G11C 19/28
See application file for complete search history.

(56) References Cited

U.S. PATENT DOCUMENTS

2004/0189585 A1* 9/2004 Moon .................. G11C 19/184
345/100
2010/0007598 A1* 1/2010 Chan .................... G09G 3/3677
345/100

(Continued)

FOREIGN PATENT DOCUMENTS

CN    103295522 A    9/2013
CN    104537980 A    4/2015

(Continued)

OTHER PUBLICATIONS

International Search Report and Written Opinion in PCT/CN2016/099287 dated Nov. 25, 2016. 18 pages.

(Continued)

*Primary Examiner* — Tom Sheng
(74) *Attorney, Agent, or Firm* — Womble Bond Dickinson (US) LLP

(57) ABSTRACT

A shift register unit is disclosed which includes a first control module operable to a) output a signal synchronous with a second clock signal to a second signal output terminal during a duration and to b) generate a first internal control signal, a first output module operable to output a first voltage to a first signal output terminal during the duration in response to the first internal control signal, a second control module operable to generate a second internal control signal, and a second output terminal operable to output a second voltage to the first signal output terminal at an end of the duration in response to the second internal control signal. Also disclosed are a method of driving the shift register unit, a scan driving circuit and a display apparatus.

20 Claims, 5 Drawing Sheets

(56) References Cited

U.S. PATENT DOCUMENTS

| | | |
|---|---|---|
| 2011/0234565 A1 | 9/2011 | Morii et al. |
| 2013/0093743 A1* | 4/2013 | Takahashi ............ G09G 3/3677 345/211 |
| 2013/0141315 A1* | 6/2013 | Chen .................... G11C 19/184 345/55 |
| 2013/0249884 A1* | 9/2013 | Kim ..................... G09G 3/3677 345/212 |
| 2014/0028659 A1* | 1/2014 | Yamazaki ................ G09G 3/36 345/213 |
| 2014/0035891 A1* | 2/2014 | Tanaka .................... G09G 3/20 345/204 |
| 2014/0118237 A1* | 5/2014 | Wang ..................... G11C 19/28 345/100 |
| 2014/0168182 A1* | 6/2014 | Yamamoto ........... G09G 3/3655 345/205 |
| 2015/0279481 A1* | 10/2015 | Sasaki ................. G11C 19/184 377/69 |
| 2016/0189648 A1* | 6/2016 | Xiao .................... G09G 3/3677 345/212 |
| 2016/0225341 A1 | 8/2016 | Ma et al. |
| 2016/0259455 A1* | 9/2016 | Li ........................ G06F 3/0412 |
| 2017/0004801 A1 | 1/2017 | Li et al. |
| 2017/0032750 A1 | 2/2017 | Shao et al. |
| 2017/0154565 A1* | 6/2017 | Qing .................... G09G 3/3611 |
| 2017/0178584 A1* | 6/2017 | Ma ....................... G09G 3/3677 |
| 2017/0200418 A1 | 7/2017 | Zhang et al. |
| 2017/0309240 A1* | 10/2017 | Zhang ................. G09G 3/3677 |

FOREIGN PATENT DOCUMENTS

| | | |
|---|---|---|
| CN | 104637462 A | 5/2015 |
| CN | 104715734 A | 6/2015 |
| CN | 104732950 A | 6/2015 |
| CN | 105047124 A | 11/2015 |
| CN | 105185287 A | 12/2015 |
| CN | 105185411 A | 12/2015 |
| CN | 105679248 A | 6/2016 |
| EP | 2725571 A1 | 4/2014 |

OTHER PUBLICATIONS

Office Action in Chinese Application No. 201610006590.8 dated Aug. 25, 2017, with English translation.

* cited by examiner

SHIFT REGISTER UNIT, DRIVING METHOD THEREOF, SCAN DRIVING CIRCUIT AND DISPLAY APPARATUS

CROSS-REFERENCE TO RELATED APPLICATIONS

The present application is the U.S. national phase entry of PCT/CN2016/099287, with an international filing date of Sep. 19, 2016, which claims the benefit of Chinese Patent Application No. 201610006590.8, filed on Jan. 4, 2016, the entire disclosures of which are incorporated herein by reference.

TECHNICAL FIELD

The present disclosure relates to the field of display technologies, and particularly to a shift register unit, a driving method thereof, a scan driving circuit and a display apparatus.

BACKGROUND

A typical active matrix organic light-emitting diode (AMOLED) pixel circuit is shown in FIG. 1. In a data write phase, a transistor T1 is turned on under control of a first scan signal line S1, and a data voltage is written from a data line Dm to a gate of a driving transistor Td through the transistor T1. In a light emission phase, a single-pulse signal having a width comparable to that of a clock signal is supplied from a second scan signal line S2 to a gate of a switch transistor T2 such that the switch transistor T2 is driven to remain turned-on within a lapse of time corresponding to the pulse width. In this case, the OLED may be driven by a current flowing through the driving transistor Td and the switch transistor T2 to emit light.

Adjustment of grayscales of luminance may be achieved by adjusting the data voltage. However, there may be a large deviation between the adjusted grayscale and a desired grayscale, thereby affecting the display effect.

Therefore, there is a need for an alternative for adjusting the luminance of an image displayed by a display panel.

SUMMARY

Embodiments of the present disclosure provide a shift register unit, a driving method thereof, a scan driving circuit and a display apparatus. The proposed scan driving circuit may be used to control a length of time for light emission by an OLED in an OLED display panel, thus adjusting the luminance of an image displayed.

According to a first aspect of the present disclosure, a shift register unit is provided comprising: a first control signal terminal for receiving a first control signal; a second control signal terminal for receiving a second control signal; a first clock signal terminal for receiving a first clock signal; a second clock signal terminal for receiving a second clock signal; a first voltage terminal for receiving a first voltage; a second voltage terminal for receiving a second voltage; a first signal output terminal and a second signal output terminal; a first control module operable to a) output a signal synchronous with the second clock signal to the second signal output terminal during a duration and to b) generate a first internal control signal at a first node, in response to the first control signal, the second control signal, the first clock signal, the second clock signal and the first voltage; a first output module operable to output the first voltage to the first signal output terminal during the duration in response to the first internal control signal; a second control module operable to generate a second internal control signal at a second node in response to the second control signal, the first clock signal, the second clock signal, the first voltage and the first internal control signal; and a second output terminal operable to output the second voltage to the first signal output terminal at an end of the duration in response to the second internal control signal.

In some embodiments, the first control module is configured to adjust the duration as a function of a length of a time period in which the first control signal and the second control signal are active.

In some embodiments, the first output module comprises a first transistor having a gate connected to the first node, a first electrode connected to the first voltage terminal, and a second electrode connected to the first signal output terminal.

In some embodiments, the second output module comprises a second transistor having a gate connected to the second node, a first electrode connected to the second voltage terminal, and a second electrode connected to the first signal output terminal.

In some embodiments, the first control module comprises: a third transistor having a gate connected to the first clock signal terminal, a first electrode connected to the first control signal terminal, and a second electrode connected to a third node; a fifth transistor having a gate connected to the third node, a first electrode connected to the first voltage terminal, a second electrode connected to a fourth node; a sixth transistor having a gate connected to the first clock signal terminal, a first electrode connected to the second control signal terminal, and a second electrode connected to the fourth node; a seventh transistor having a gate connected to the fourth node, a first electrode connected to the first voltage terminal, and a second terminal connected to the second signal output terminal; an eighth transistor having a gate connected to the third node, a first electrode connected to the second clock signal terminal, and a second electrode connected to the second signal output terminal; a ninth transistor having a gate connected to the second clock signal terminal, a first electrode connected to the second signal output terminal, and a second electrode connected to the first node; a third capacitor having a terminal connected to the third node and another terminal connected to the second signal output terminal; a fourth capacitor having a terminal connected to the first voltage terminal and another terminal connected to the fourth node; and a first capacitor having a terminal connected to the first voltage terminal and another terminal connected to the first node.

In some embodiments, the second control module comprises: a fourth transistor having a gate connected to the first clock signal terminal, a first electrode connected to the second control signal terminal, and a second electrode connected to the second node; a tenth transistor having a gate connected to the first node, a first electrode connected to the first voltage terminal, and a second electrode connected to the second node; and a second capacitor having a terminal connected to the second clock signal terminal and another terminal connected to the second node.

According to a second aspect of the present disclosure, a scan driving circuit is provided comprising a plurality of shift register units as described in the first aspect. The first control signal terminal of the first one of the shift register units is configured to receive a first start signal, and the second control signal terminal of the first shift register unit is configured to receive a second start signal. The first control signal terminal of each of the shift register units, except the first shift register unit, is connected to the second signal output terminal of a preceding shift register unit. The second control signal terminal of each of the shift register units, except the first shift register unit, is connected to the first signal output terminal of a preceding shift register unit.

According to a third aspect of the present disclosure, a display apparatus is provided comprising: a display panel comprising a plurality of pixel units arranged in an array, each of the pixel units comprising a pixel circuit comprising a light-emitting device and a switch transistor, the switch transistor having a gate and configured to allow a driving current to flow through the light-emitting device depending on a voltage applied to the gate; and a scan driving circuit as described in the second aspect. The first signal output terminal of each of the shift register units in the scan driving circuit is connected to the gates of the switch transistors in a respective row of pixel units in the array.

According to a fourth aspect of the present disclosure, a method of driving a shift register unit is provided. The shift register unit comprises a first signal output terminal and a second signal output terminal. The method comprises: responsive to a first control signal, a second control signal, a first clock signal, a second clock signal and a first voltage, outputting a signal synchronous with the second clock signal to the second signal output terminal and generating a first internal control signal; responsive to the first internal control signal, outputting the first voltage to the first signal output terminal; responsive to the second control signal, the first clock signal, the second clock signal, the first voltage and the first internal control signal, generating a second internal control signal; and responsive to the second internal control signal, outputting a second voltage to the first signal output terminal.

In some embodiments, outputting the signal synchronous with the second clock signal to the second signal output terminal and outputting the first voltage to the first signal output terminal are simultaneously initiated and terminated.

In some embodiments, the outputting of the signal synchronous with the second clock signal to the second signal output terminal and the outputting of the first voltage to the first signal output terminal last for a duration.

In some embodiments, the method further comprises adjusting the duration by changing a length of a time period in which the first control signal and the second control signal are active.

These and other aspects of the present disclosure will be apparent from and elucidated with reference to the embodiment(s) described hereinafter.

DETAILED DESCRIPTION

Embodiments of the present disclosure will be described clearly and fully with reference to the accompanying drawings. Apparently, the embodiments described are only a part and not all of the embodiments of the present disclosure. All other embodiments derived by those skilled in the art from the embodiments of the present disclosure without making any inventive effort fall within the scope of the present disclosure.

Figure 2:
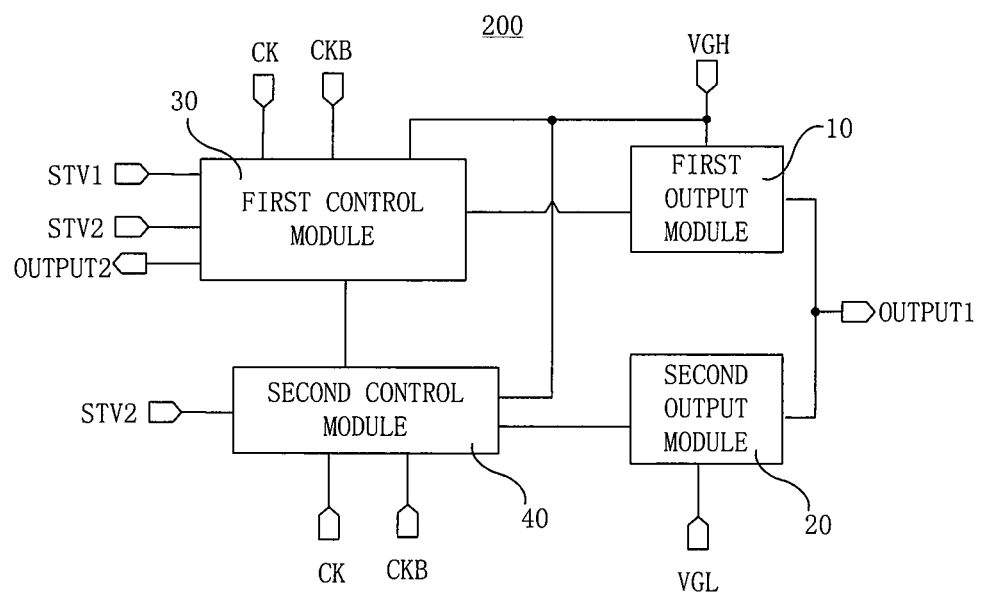
FIG. 2 is a schematic block diagram of a shift register unit according to an embodiment of the present disclosure.

FIG. 2 is a schematic block diagram of a shift register unit 200 according to an embodiment of the present disclosure.

Referring to FIG. 2, the shift register unit 200 comprises a first control signal terminal STV1 for receiving a first control signal, a second control signal terminal STV2 for receiving a second control signal, a first clock signal terminal CK for receiving a first clock signal, a second clock signal terminal CKB for receiving a second clock signal, a first voltage terminal VGH for receiving a first voltage, a second voltage terminal VGL for receiving a second voltage, a first signal output terminal OUTPUT1 and a second signal output terminal OUTPUT2. The shift register unit 200 further comprises a first output module 10, a second output terminal 20, a first control module 10 and a second control module 40.

The first control module 30 is operable to a) output a signal synchronous with the second clock signal CKB to the second signal output terminal OUTPUT2 during a duration and to b) generate a first internal control signal at a first node (not shown in FIG. 2), in response to the first control signal, the second control signal, the first clock signal, the second clock signal and the first voltage.

As will be described later, the first control module 30 is configured to adjust the duration as a function of a length of a time period in which the first control signal and the second control signal are active.

The first output module 10 is operable to output the first voltage to the first signal output terminal OUTPUT1 during the duration in response to the first internal control signal.

The second control module 40 is operable to generate a second internal control signal at a second node (not shown in FIG. 2) in response to the second control signal, the first clock signal, the second clock signal, the first voltage and the first internal control signal.

The second output terminal 20 is operable to output the second voltage to the first signal output terminal OUTPUT1 at an end of the duration in response to the second internal control signal.

Details of the shift register unit 200 are described below with reference to FIGS. 3 and 4.

Figure 3:
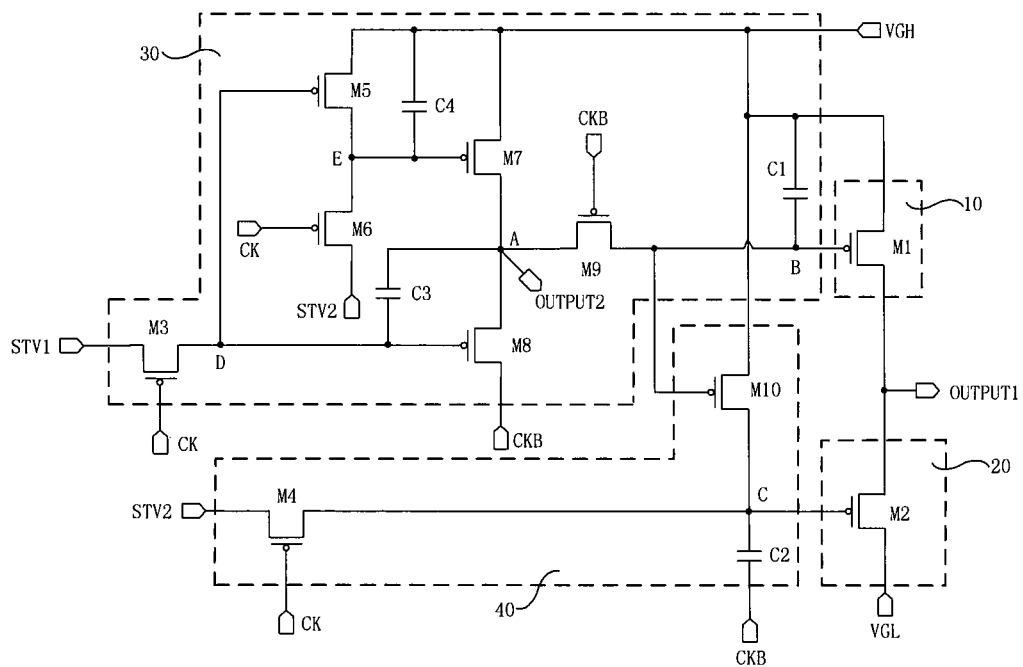
FIG. 3 is an exemplary circuit diagram of the shift register unit as shown in FIG. 2.

FIG. 3 is an exemplary circuit diagram of the shift register unit 200 as shown in FIG. 2.

Referring to FIG. 3, the first output module 10 comprises a first transistor M1. The first transistor M1 has a gate connected to the first node B, a first electrode connected to the first voltage terminal VGH, and a second electrode connected to the first signal output terminal OUTPUT1. In this example, the voltage signal at the first node B serves as the first internal control signal.

The present disclosure is not so limited. For example, the first output module 10 may further comprise one or more transistors connected in parallel with the first transistor M1, and/or one or more capacitors connected in parallel with the first capacitor C1.

The second output module 20 comprises a second transistor M2. The second transistor M2 has a gate connected to the second node C, a first electrode connected to the second voltage terminal VGL, and a second electrode connected to the first signal output terminal OUTPUT1. In this example, the voltage signal at the second node C serves as the second internal control signal.

The present disclosure is not so limited. For example, the second output module 20 may further comprise one or more transistors connected in parallel with the second transistor M2, and/or one or more capacitors connected in parallel with the second capacitor C2.

The first control module 30 comprises a third transistor M3, a fifth transistor M5, a sixth transistor M6, a seventh transistor M7, an eighth transistor M8, a ninth transistor M9, a third capacitor C3, a fourth capacitor C4 and a first capacitor C1.

The third transistor M3 has a gate connected to the first clock signal terminal CK, a first electrode connected to the first control signal terminal STV1, and a second electrode connected to a third node D.

The fifth transistor M5 has a gate connected to the third node D, a first electrode connected to the first voltage terminal VGH, a second electrode connected to a fourth node E.

The sixth transistor M6 has a gate connected to the first clock signal terminal CK, a first electrode connected to the second control signal terminal STV2, and a second electrode connected to the fourth node E.

The seventh transistor M7 has a gate connected to the fourth node E, a first electrode connected to the first voltage terminal VGH, and a second terminal connected to the second signal output terminal OUTPUT2. In FIG. 3, the second signal output terminal OUTPUT2 is shown as being lead out from a node A.

The eighth transistor M8 has a gate connected to the third node D, a first electrode connected to the second clock signal terminal CKB, and a second electrode connected to the second signal output terminal OUTPUT2. The ninth transistor M9 has a gate connected to the second clock signal terminal CKB, a first electrode connected to the second signal output terminal OUTPUT2, and a second electrode connected to the first node B.

The third capacitor C3 has a terminal connected to the third node D and another terminal connected to the second signal output terminal OUTPUT2. The fourth capacitor C4 has a terminal connected to the first voltage terminal VGH and another terminal connected to the fourth node E. The first capacitor C1 has a terminal connected to the first voltage terminal VGH and another terminal connected to the first node B.

The present disclosure is not so limited. For example, the first control module 30 may further comprise multiple transistors connected in parallel with the third transistor M3, the fifth transistor M5, the sixth transistor M6, the seventh transistor M7, the eighth transistor M8 and the ninth transistor M9, respectively, and/or multiple capacitors connected in parallel with the third capacitor C3, the fourth capacitor C4 and the first capacitor C1.

The second control module 40 comprises a fourth transistor M4, a tenth transistor M10 and a second capacitor C2.

The fourth transistor M4 has a gate connected to the first clock signal terminal CK, a first electrode connected to the second control signal terminal STV2, and a second electrode connected to the second node C.

The tenth transistor M10 has a gate connected to the first node B, a first electrode connected to the first voltage terminal VGH, and a second electrode connected to the second node C.

The second capacitor C2 has a terminal connected to the second clock signal terminal CKB and another terminal connected to the second node C.

The present disclosure is not so limited. For example, the second control module 40 may further comprise multiple transistors connected in parallel with the fourth transistor M4 and the tenth transistor M10, respectively.

In FIG. 3, the individual transistors are shown as P-type transistors, the first voltage terminal VGH is supplied with a high level, and the second voltage terminal VGL is supplied with a low level. The gate-on voltage for turning on a P-type transistor has a low level, and the gate-off voltage for turning off a P-type transistor has a high level.

Other embodiments are possible. For example, the individual transistors may be N-type transistors. The gate-on voltage for turning on an N-type transistor has a high level, and the gate-off voltage for turning off an N-type transistor has a low level. In addition, the transistors are in general fabricated such that their first electrodes and second electrodes can be used interchangeably.

Figure 4:
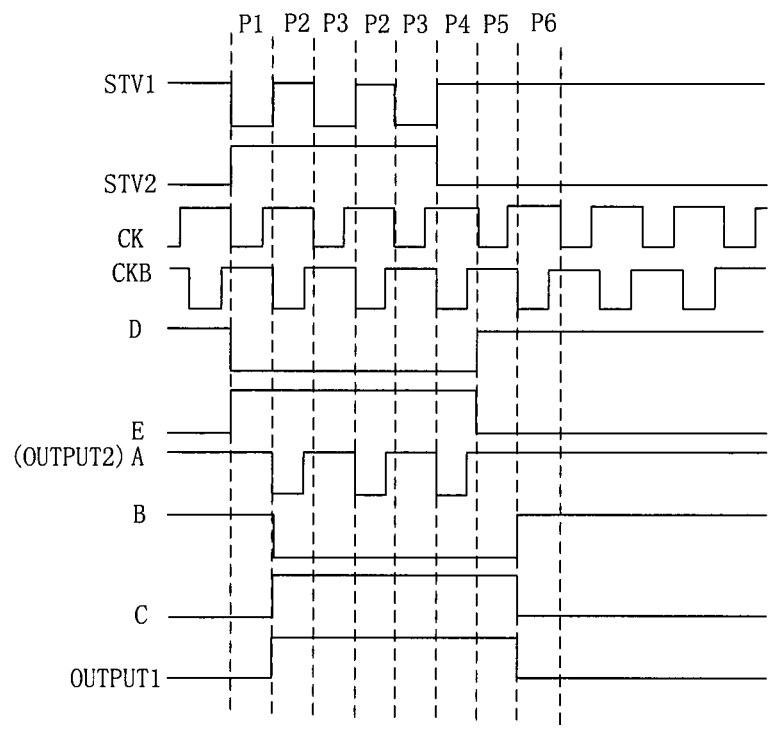
FIG. 4 is a timing diagram of the circuit of the shift register unit as shown in FIG. 3.

FIG. 4 is a timing diagram of the circuit of the shift register unit as shown in FIG. 3.

In a first phase P1, since the first clock signal terminal CK is at a low level, the third transistor M3, the fourth transistor M4 and the sixth transistor M6 are turned on. The low level of the first control signal STV1 is transferred to the third node D through the third transistor M3. Under control of the third node D, the eighth transistor M8 and the fifth transistor M5 are turned on, and the low level of the third node D is stored by the third capacitor C3. The high level of the first voltage terminal VGH is transferred to the fourth node E and the gate of the seventh transistor M7 through the fifth transistor M5. The high level of the second control signal terminal STV2 is transferred to the fourth node E and the gate of the seventh transistor M7 through the sixth transistor M6, and thus the seventh transistor M7 is turned off.

The high level of the second clock signal terminal CKB is transferred to the node A and the second signal output terminal OUTPUT2 through the eighth transistor M8. Due to the high level of the second clock signal terminal CKB, the ninth transistor M9 is turned off. The high level stored by the first capacitor C1 at the end of the last period is transferred to the gates of the first transistor M1 and the tenth transistor M10 and to the first node B. Thus, the first transistor M1 and the tenth transistor M10 are turned off.

Since the fourth transistor M4 is turned on, the high level of the second control signal terminal STV2 is transferred to the second node C through the fourth transistor M4, and then stored by the second capacitor C2. Under control of the second node C, the second transistor M2 is turned off.

Since both the first transistor M1 and the second transistor M2 are in a turned-off state in this phase, the first signal output terminal OUTPUT1 remains at the low level that it was at the end of the last period.

In a second phase P2, since the first clock signal terminal CK is at a high level, the third transistor M3, the fourth transistor M4 and the sixth transistor M6 are turned off. The high level stored by the second capacitor C2 in the last phase is transferred to the gate of the second transistor M2, and thus the second transistor M2 is turned off.

The low level stored by the third capacitor C3 in the last phase maintains the third node D at the low level, and thus the fifth transistor M5 and the eighth transistor M8 still remain turned-on. The high level of the first voltage terminal VGH is transferred to the fourth node E and the gate of the seventh transistor M7 through the fifth transistor M5, and thus the seventh transistor M7 is turned off. The low level of the second clock signal terminal CKB is transferred to the node A and the second signal output terminal OUTPUT2 through the eighth transistor M8.

Due to the low level of the second clock signal terminal CKB, the ninth transistor M9 is turned on and transfers the low level at the node A to the gate of the first transistor M1 and the first node B. The low level is stored by the first capacitor C1. The first transistor M1 is turned on and transfers the high level of the first voltage terminal VGH to the first signal output terminal OUTPUT1.

In a third phase P3, since the first clock signal terminal CK is at a low level, the third transistor M3, the fourth transistor M4 and the sixth transistor M6 are turned on. The low level of the first control signal STV1 is transferred to the third node D through the third transistor M3. Under control of the third node D, the eighth transistor M8 and the fifth transistor M5 are turned on. The low level of the third node D is stored by the third capacitor C3. The high level of the first voltage terminal VGH is transferred to the fourth node E and the gate of the seventh transistor M7 through the fifth transistor M5. The high level of the second control signal terminal STV2 is transferred to the fourth node E and the gate of the seventh transistor M7 through the sixth transistor M6, and thus the seventh transistor M7 is turned off.

The high level of the second clock signal terminal CKB is transferred to the node A and the second signal output terminal OUTPUT2 through the eighth transistor M8. Due to the high level of the second clock signal terminal CKB, the ninth transistor M9 is turned off. Due to the low level stored by the first capacitor C1, the node B is at a low level. Under control of the node B, the tenth transistor M10 and the first transistor M1 are turned on. The high level of the first voltage terminal VGH is transferred to the second node C through the tenth transistor M10, and to the first signal output terminal OUTPUT1 through the first transistor M1.

In a fourth phase P4, since the first clock signal terminal CK is at a high level, the third transistor M3, the fourth transistor M4 and the sixth transistor M6 are turned off. The low level stored by the third capacitor C3 maintains the third node D at the low level. Under control of the third node D, the eighth transistor M8 and the fifth transistor M5 are turned on. The high level of the first voltage terminal VGH is transferred to the fourth node E and the gate of the seventh transistor M7 through the fifth transistor M5, and thus the seventh transistor M7 is turned off. The low level of the second clock signal terminal CKB is transferred to the node A and the second signal output terminal OUTPUT2 through the eighth transistor M8.

Since the second clock signal terminal CKB is at the low level, the ninth transistor M9 is turned on such that the low level at the node A is transferred through the ninth transistor M9 to the gates of the tenth transistor M10 and the first transistor M1 and to the first node B. The low level is stored by the first capacitor C1. The tenth transistor M10 is turned on and transfers the high level of the first voltage terminal VGH to the gate of the second transistor M2 such that the second transistor M2 is turned off. The high level of the first voltage terminal VGH is transferred to the first signal output terminal OUTPUT1 through the first transistor M1.

In a fifth phase P5, since the first clock signal terminal CK is at a low level, the third transistor M3, the fourth transistor M4 and the sixth transistor M6 are turned on. The high level of the first control signal terminal STV1 is transferred to the third node D through the third transistor M3. The high level is stored by the third capacitor C3. Under control of the node D, the fifth transistor M5 and the eighth transistor M8 are turned off. Since the sixth transistor M6 is turned on, the low level of the second control signal terminal STV2 is transferred to the fourth node E and the gate of the seventh transistor M7 through the sixth transistor M6, and thus the seventh transistor M7 is turned on. The low level is stored by the fourth capacitor C4. The high level of the first voltage terminal VGH is transferred to the node A and the second signal output terminal OUTPUT2 through the seventh transistor M7.

Since the second clock signal terminal CKB is at the high level, the ninth transistor M9 is turned off. The low level stored by the first capacitor maintains the tenth transistor M10 and the first transistor M1 turned-on. The high level of the first voltage terminal VGH is transferred to the second node C through the tenth transistor M10, and the low level of the second signal control terminal STV2 is transferred to the node C through the fourth transistor M4 such that the level of the node C is between the high level and the low level and sufficient to turn off the second transistor. The high level of the first voltage terminal VGH is transferred to the first signal output terminal OUTPUT1 through the first transistor M1.

In a sixth phase P6, since the first clock signal terminal CK is at a high level, the third transistor M3, the fourth transistor M4 and the sixth transistor M6 are turned off. The high level stored by the third capacitor C3 maintains the node D at the high level. Under control of the node D, the fifth transistor M5 and the eighth transistor M8 are turned off. The seventh transistor M7 is turned on by the low level stored by the fourth capacitor C4. At this point, the high level of the first voltage terminal VGH is transferred to the node A and the second signal output terminal OUTPUT2 through the seventh transistor M7.

Since the second clock signal terminal CKB is at the low level, the ninth transistor M9 is turned on and transfers the high level at the node A to the gates of the first transistor M1 and the tenth transistor M10 such that the first transistor M1 and the tenth transistor M10 are turned off.

The low level output by the second clock signal terminal CKB causes the level at the node C to be pulled down, thus turning on the second transistor M2. The low level of the second voltage terminal VGL is output to the first signal output terminal OUTPUT1 through the second transistor M2.

Thereafter, the first signal output terminal OUTPUT1 keeps outputting the low level until the second phase of a next period.

It can be seen that during a duration from the second phase P2 to the fifth phase P5, the first signal output terminal OUTPUT1 outputs a high level signal and the second signal output terminal OUTPUT2 outputs a signal synchronous with the second clock signal CKB (i.e., they have the same waveform). This is achieved by means of the operation of the first control module 30 of the shift register unit shown in FIG. 3.

The operations of the second phase P2 and the third phase P3 may be repeated alternatingly such that the duration may be adjusted by changing the number of the second phases P2 and the third phases P3 included in the first control signal STV1 and the second control signal STV2.

In the timing sequence shown in FIG. 4, the first control signal STV1 and the second control signal STV2 may be regarded active within the time period from the first phase P1 to the last one of the third phases P3. The active first control signal STV1 is a square waveform signal, and the active second control signal STV2 has a level of the first voltage.

As will be described below, the high level signal output by the first output terminal OUTPUT1 may be used to drive the OLED in the pixel circuit to emit light. That is to say, the length of time for light emission by the OLED may be adjusted by changing the length of the time period in which the first control signal STV1 and the second control signal STV2 are active. The more the second phases P2 and the third phases P3 are repeated, the longer the duration in which the first signal output terminal OUTPUT1 outputs the high level signal is, and so is the time for light emission by the OLED. Thereby, the images may be displayed at an adjustable luminance.

In some embodiments, the adjustment of the length of time for light emission may be combined with the adjustment of the voltage, thus providing a flexible and refined adjustment of the luminance.

Figure 5:
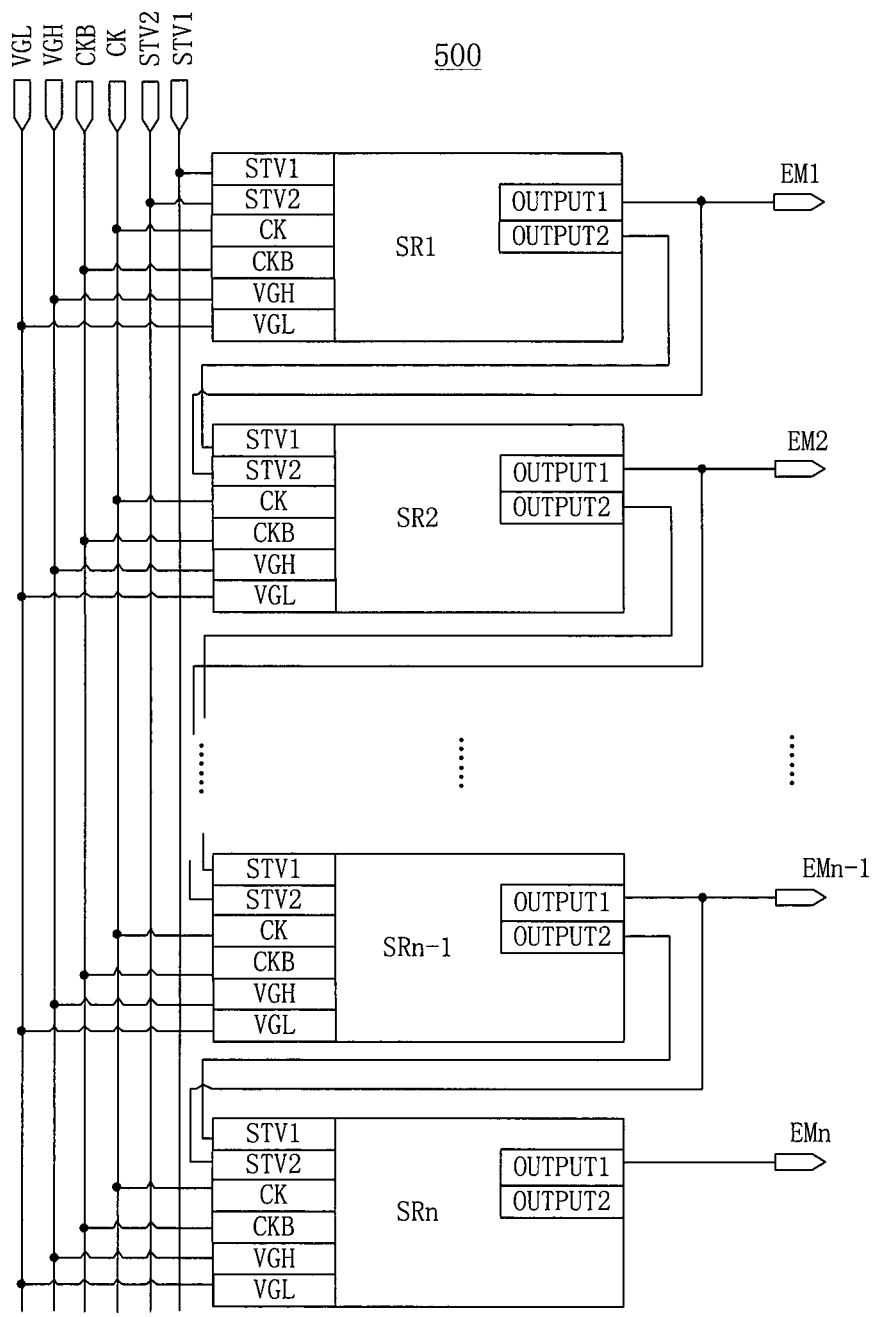
FIG. 5 is a schematic block diagram of a scan driving circuit according to an embodiment of the present disclosure.

FIG. 5 is a schematic block diagram of a scan driving circuit 500 according to an embodiment of the present disclosure.

Referring to FIG. 5, the scan driving circuit 500 comprises a plurality of shift register units SR1, SR2, . . . SRn–1, SRn, each of which may be the shift register unit 200 as described above. The first signal output terminals OUTPUT1 of the shift register units SR1, SR2, . . . SRn–1, SRn provide output signals to the control lines EM1, EM2, . . . , EMn–1, EMn, respectively. Details of the shift register unit 200 have been set forth in the above embodiments, and are omitted here for simplicity.

The first control signal terminal STV1 of the first shift register unit SR1 is used to receive a first start signal, and the second control signal terminal STV2 of the first shift register unit SR1 is used to receive a second start signal.

Excepting the first shift register unit SR1, the first control signal terminal STV1 of each of the shift register units SR2, . . . SRn–1, SRn is connected to the second signal output terminal OUTPUT2 of a preceding shift register unit.

Excepting the first shift register unit SR1, the second control signal terminal STV2 of each of the shift register units SR2, . . . SRn–1, SRn is connected to the first signal output terminal OUTPUT1 of a preceding shift register unit.

The second signal output terminal OUTPUT2 of the last shift register unit SRn is floated.

Figure 6:
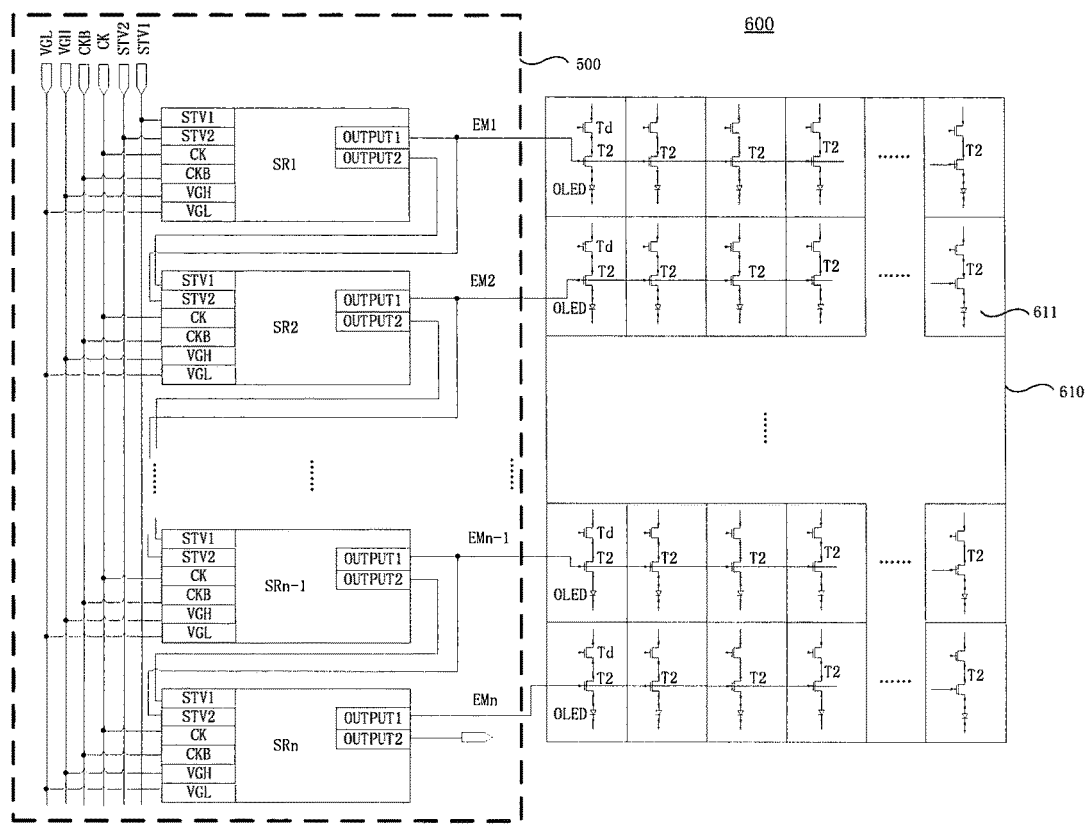
FIG. 6 is a schematic diagram of a display apparatus according to an embodiment of the present disclosure.

FIG. 6 is a schematic diagram of a display apparatus 600 according to an embodiment of the present disclosure.

Figure 1:
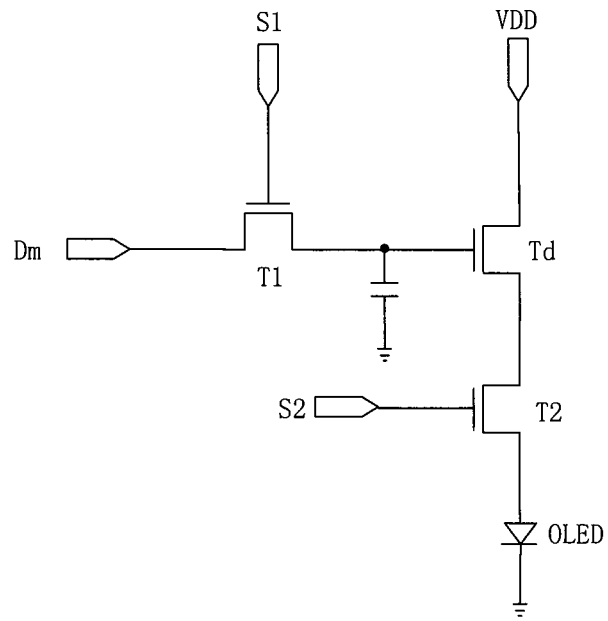
FIG. 1 is a schematic circuit diagram of a prior art pixel circuit.

Referring to FIG. 6, the display apparatus 600 comprises a display panel 610 which comprises a plurality of pixel units 611. Each of the pixel units 611 comprises a light-emitting device and a switch transistor, which switch transistor has a gate and is configured to allow a driving current to flow through the light-emitting device depending on a voltage applied to the gate. Specifically, each pixel unit 611 may comprise a pixel circuit as shown in e.g. FIG. 1. This pixel circuit comprises a driving transistor Td, a switch transistor T2 and a light-emitting device OLED that are connected in series. In the example of FIG. 6, the rest of the components in the pixel unit 611 are not shown for simplicity.

The display apparatus 600 further comprises a scan driving circuit 500 as described in the above embodiments. The first signal output terminal OUTPUT1 of each of the shift register units SR1, SR2, . . . SRn–1, SRn in the scan driving circuit 500 is connected to the gates of the switch transistors T2 in a respective row of pixel units. In the example of FIG. 6, the first signal output terminal OUTPUT1 of the first shift register unit SR1 is connected to the gates of the switch transistors T2 in the first row of pixel units through the control line EM1, the first signal output terminal OUTPUT1 of the second shift register unit SR2 is connected to the gates of the switch transistors T2 in the second row of pixel units through the control line EM2, and the like.

In this embodiment, examples of the display apparatus include any display apparatus based on organic light-emitting diodes, such as a television, a digital photo-frame, a cellphone or a tablet.

Figure 7:
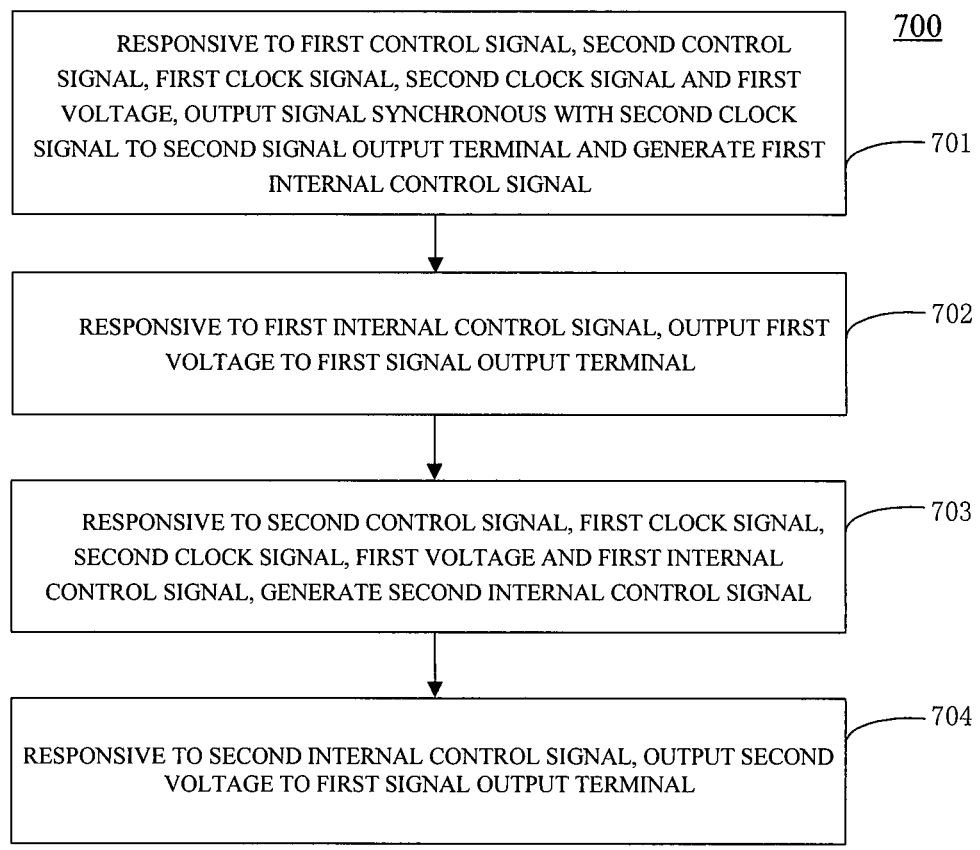
FIG. 7 is a flow chart of method of driving a shift register unit according to an embodiment of the present disclosure.

FIG. 7 is a flow chart of method 700 of driving a shift register unit according to an embodiment of the present disclosure, wherein the shift register unit may be the shift register unit 200 as described above with respect to FIGS. 2-4.

At box 701, responsive to a first control signal, a second control signal, a first clock signal, a second clock signal and a first voltage, a signal synchronous with the second clock signal is output to the second signal output terminal and a first internal control signal is generated.

At box 702, responsive to the first internal control signal, the first voltage is output to the first signal output terminal.

At box 703, responsive to the second control signal, the first clock signal, the second clock signal, the first voltage and the first internal control signal, a second internal control signal is generated.

At box 704, responsive to the second internal control signal, the second voltage is output to the first signal output terminal.

Referring back to FIG. 4, outputting the signal synchronous with the second clock signal to the second signal output terminal and outputting the first voltage to the first signal output terminal are simultaneously initiated and terminated. The operations of the method 700 have been described above in detail with respect to FIGS. 3 and 4, and are not repeated here for simplicity.

The foregoing are only specific embodiments of the present disclosure, and the scope of the present disclosure is not so limited. Variations and alternatives that are easily occurred to those skilled in the art should be encompassed in the scope of the present disclosure. Therefore, the scope of the present disclosure should be defined by the claims.

What is claimed is:

1. A shift register unit, comprising:
   a first control signal terminal for receiving a first control signal;
   a second control signal terminal for receiving a second control signal;
   a first clock signal terminal for receiving a first clock signal;
   a second clock signal terminal for receiving a second clock signal;
   a first voltage terminal for receiving a first voltage;
   a second voltage terminal for receiving a second voltage;
   a first signal output terminal and a second signal output terminal;
   a first control module operable to a) output a signal synchronous with the second clock signal to the second signal output terminal during a duration and to b) generate a first internal control signal at a first node, in response to the first control signal, the second control signal, the first clock signal, the second clock signal and the first voltage;
   a first output module operable to output the first voltage to the first signal output terminal during the duration in response to the first internal control signal;

a second control module operable to generate a second internal control signal at a second node in response to the second control signal, the first clock signal, the second clock signal, the first voltage and the first internal control signal; and a second output module operable to output the second voltage to the first signal output terminal at an end of the duration in response to the second internal control signal.

2. The shift register unit of claim 1, wherein the first control module is configured to adjust the duration as a function of a length of a time period in which the first control signal and the second control signal are active.

3. A scan driving circuit comprising a plurality of shift register units as recited in claim 2, wherein:
    the first control signal terminal of the first one of the shift register units is configured to receive a first start signal, and the second control signal terminal of the first shift register unit is configured to receive a second start signal;
    the first control signal terminal of each of the shift register units, except the first shift register unit, is connected to the second signal output terminal of a preceding shift register unit; and
    the second control signal terminal of each of the shift register units, except the first shift register unit, is connected to the first signal output terminal of a preceding shift register unit.

4. A display apparatus comprising:
    a display panel comprising a plurality of pixel units arranged in an array, each of the pixel units comprising a pixel circuit comprising a light-emitting device and a switch transistor, the switch transistor having a gate and configured to allow a driving current to flow through the light-emitting device depending on a voltage applied to the gate; and
    a scan driving circuit as recited in claim 3,
    wherein the first signal output terminal of each of the shift register units in the scan driving circuit is connected to the gates of the switch transistors in a respective row of pixel units in the array.

5. The shift register unit of claim 1, wherein the first output module comprises a first transistor having a gate connected to the first node, a first electrode connected to the first voltage terminal, and a second electrode connected to the first signal output terminal.

6. A scan driving circuit comprising a plurality of shift register units as recited in claim 5, wherein:
    the first control signal terminal of the first one of the shift register units is configured to receive a first start signal, and the second control signal terminal of the first shift register unit is configured to receive a second start signal;
    the first control signal terminal of each of the shift register units, except the first shift register unit, is connected to the second signal output terminal of a preceding shift register unit; and
    the second control signal terminal of each of the shift register units, except the first shift register unit, is connected to the first signal output terminal of a preceding shift register unit.

7. A display apparatus comprising:
    a display panel comprising a plurality of pixel units arranged in an array, each of the pixel units comprising a pixel circuit comprising a light-emitting device and a switch transistor, the switch transistor having a gate and configured to allow a driving current to flow through the light-emitting device depending on a voltage applied to the gate; and
    a scan driving circuit as recited in claim 6,
    wherein the first signal output terminal of each of the shift register units in the scan driving circuit is connected to the gates of the switch transistors in a respective row of pixel units in the array.

8. The shift register unit of claim 1, wherein the second output module comprises a second transistor having a gate connected to the second node, a first electrode connected to the second voltage terminal, and a second electrode connected to the first signal output terminal.

9. A scan driving circuit comprising a plurality of shift register units as recited in claim 8, wherein:
    the first control signal terminal of the first one of the shift register units is configured to receive a first start signal, and the second control signal terminal of the first shift register unit is configured to receive a second start signal;
    the first control signal terminal of each of the shift register units, except the first shift register unit, is connected to the second signal output terminal of a preceding shift register unit; and
    the second control signal terminal of each of the shift register units, except the first shift register unit, is connected to the first signal output terminal of a preceding shift register unit.

10. A display apparatus comprising:
    a display panel comprising a plurality of pixel units arranged in an array, each of the pixel units comprising a pixel circuit comprising a light-emitting device and a switch transistor, the switch transistor having a gate and configured to allow a driving current to flow through the light-emitting device depending on a voltage applied to the gate; and
    a scan driving circuit as recited in claim 9,
    wherein the first signal output terminal of each of the shift register units in the scan driving circuit is connected to the gates of the switch transistors in a respective row of pixel units in the array.

11. The shift register unit of claim 1, wherein the first control module comprises:
    a third transistor having a gate connected to the first clock signal terminal, a first electrode connected to the first control signal terminal, and a second electrode connected to a third node;
    a fifth transistor having a gate connected to the third node, a first electrode connected to the first voltage terminal, a second electrode connected to a fourth node;
    a sixth transistor having a gate connected to the first clock signal terminal, a first electrode connected to the second control signal terminal, and a second electrode connected to the fourth node;
    a seventh transistor having a gate connected to the fourth node, a first electrode connected to the first voltage terminal, and a second terminal connected to the second signal output terminal;
    an eighth transistor having a gate connected to the third node, a first electrode connected to the second clock signal terminal, and a second electrode connected to the second signal output terminal;
    a ninth transistor having a gate connected to the second clock signal terminal, a first electrode connected to the second signal output terminal, and a second electrode connected to the first node;

a third capacitor having a terminal connected to the third node and another terminal connected to the second signal output terminal;
a fourth capacitor having a terminal connected to the first voltage terminal and another terminal connected to the fourth node; and
a first capacitor having a terminal connected to the first voltage terminal and another terminal connected to the first node.

12. A scan driving circuit comprising a plurality of shift register units as recited in claim 11, wherein:
the first control signal terminal of the first one of the shift register units is configured to receive a first start signal, and the second control signal terminal of the first shift register unit is configured to receive a second start signal;
the first control signal terminal of each of the shift register units, except the first shift register unit, is connected to the second signal output terminal of a preceding shift register unit; and
the second control signal terminal of each of the shift register units, except the first shift register unit, is connected to the first signal output terminal of a preceding shift register unit.

13. The shift register unit of claim 1, wherein the second control module comprises:
a fourth transistor having a gate connected to the first clock signal terminal, a first electrode connected to the second control signal terminal, and a second electrode connected to the second node;
a tenth transistor having a gate connected to the first node, a first electrode connected to the first voltage terminal, and a second electrode connected to the second node; and
a second capacitor having a terminal connected to the second clock signal terminal and another terminal connected to the second node.

14. A scan driving circuit comprising a plurality of shift register units as recited in claim 13, wherein:
the first control signal terminal of the first one of the shift register units is configured to receive a first start signal, and the second control signal terminal of the first shift register unit is configured to receive a second start signal;
the first control signal terminal of each of the shift register units, except the first shift register unit, is connected to the second signal output terminal of a preceding shift register unit; and
the second control signal terminal of each of the shift register units, except the first shift register unit, is connected to the first signal output terminal of a preceding shift register unit.

15. A scan driving circuit comprising a plurality of shift register units as recited in claim 1, wherein:
the first control signal terminal of the first one of the shift register units is configured to receive a first start signal, and the second control signal terminal of the first shift register unit is configured to receive a second start signal;
the first control signal terminal of each of the shift register units, except the first shift register unit, is connected to the second signal output terminal of a preceding shift register unit; and
the second control signal terminal of each of the shift register units, except the first shift register unit, is connected to the first signal output terminal of a preceding shift register unit.

16. A display apparatus comprising:
a display panel comprising a plurality of pixel units arranged in an array, each of the pixel units comprising a pixel circuit comprising a light-emitting device and a switch transistor, the switch transistor having a gate and configured to allow a driving current to flow through the light-emitting device depending on a voltage applied to the gate; and
a scan driving circuit as recited in claim 15,
wherein the first signal output terminal of each of the shift register units in the scan driving circuit is connected to the gates of the switch transistors in a respective row of pixel units in the array.

17. A method of driving a shift register unit, the shift register unit comprising a first signal output terminal and a second signal output terminal, the method comprising:
responsive to a first control signal, a second control signal, a first clock signal, a second clock signal and a first voltage, outputting a signal synchronous with the second clock signal to the second signal output terminal and generating a first internal control signal;
responsive to the first internal control signal, outputting the first voltage to the first signal output terminal;
responsive to the second control signal, the first clock signal, the second clock signal, the first voltage and the first internal control signal, generating a second internal control signal; and
responsive to the second internal control signal, outputting a second voltage to the first signal output terminal.

18. The method of claim 17, wherein outputting the signal synchronous with the second clock signal to the second signal output terminal and outputting the first voltage to the first signal output terminal are simultaneously initiated and terminated.

19. The method of claim 18, wherein the outputting of the signal synchronous with the second clock signal to the second signal output terminal and the outputting of the first voltage to the first signal output terminal last for a duration.

20. The method of claim 19, further comprising adjusting the duration by changing a length of a time period in which the first control signal and the second control signal are active.

* * * * *